United States Patent
Jeon

(10) Patent No.: US 9,324,390 B2
(45) Date of Patent: *Apr. 26, 2016

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: Byung Deuk Jeon, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/526,160

(22) Filed: Oct. 28, 2014

(65) Prior Publication Data

US 2016/0064049 A1    Mar. 3, 2016

(30) Foreign Application Priority Data

Aug. 28, 2014    (KR) .......................... 10-2014-0113491

(51) Int. Cl.
*G11C 7/10*        (2006.01)
*G11C 7/22*        (2006.01)

(52) U.S. Cl.
CPC .............. *G11C 7/1087* (2013.01); *G11C 7/222* (2013.01)

(58) Field of Classification Search
CPC ...... G11C 7/1051; G11C 7/1078; G11C 7/22; G11C 7/1066
USPC ............................................. 365/189.05, 193
See application file for complete search history.

(56) References Cited

U.S. PATENT DOCUMENTS

2011/0058432 A1*  3/2011  Yang ...................... G11C 7/222
                                                                    365/193
2013/0321022 A1   12/2013  Ware

* cited by examiner

*Primary Examiner* — Huan Hoang
(74) *Attorney, Agent, or Firm* — William Park & Associates Ltd.

(57) ABSTRACT

A semiconductor device includes a first data input/output unit storing first internal input data in a first cell block in response to a first shift data strobe signal generated by shifting a first data strobe signal in a test mode, a second data input/output unit storing second internal input data in a second cell block in response to a second shift data strobe signal generated by shifting a second data strobe signal in the test mode, and a connector electrically coupling the first data input/output unit to the second data input/output unit in the test mode.

20 Claims, 5 Drawing Sheets

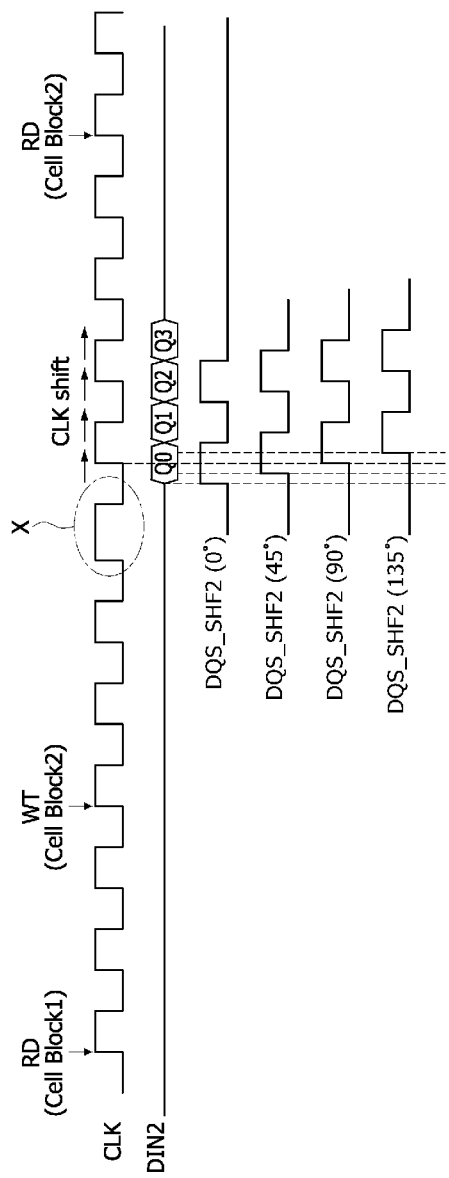

SEMICONDUCTOR DEVICES AND SEMICONDUCTOR SYSTEMS INCLUDING THE SAME

CROSS-REFERENCE TO RELATED APPLICATION

The present application claims priority under 35 U.S.C 119(a) to Korean Application No. 10-2014-0113491, filed on Aug. 28, 2014, in the Korean Intellectual Property Office, which is incorporated herein by reference in its entirety as set forth in full.

BACKGROUND

1. Technical Field

Embodiments of the present disclosure relate to semiconductor devices and semiconductor systems including the same.

2. Related Art

A system-in-package (SiP) technique and a chip-on-chip (CoC) technique have been widely used as packaging techniques for putting a large capacity of memory chip and a controller chip in a single package. The system-in-package (SiP) technique may use a wire bonding process to electrically connect a plurality of chips to each other. The chip-on-chip (CoC) technique may be a packaging technique which is suitable for increase of a memory capacity in a single package and for improvement of a data transmission speed between the memory chip and the controller chip in a single package. This is because the memory chip and the controller chip in the package communicate with each other through micro-bump pads.

The micro-bump pads may exhibit an excellent resistance characteristic, an excellent inductance characteristic and an excellent parasitic capacitance characteristic to allow the packages to operate at a high frequency. Thus, a data transmission speed may be improved by increasing the number of the micro-bump pads employed in the package. In the chip-on-chip (CoC) package, each of the memory chip and the controller chip may be fabricated to include the micro-bump pads, and the micro-bump pads of the memory chip and the controller chip may be electrically coupled to each other to produce a single unified chip including the memory chip and the controller chip.

In semiconductor memory devices, test operations may be executed to verify the functions of buffers or drivers through which data are inputted or outputted. When semiconductor packages fabricated using the chip-on-chip (CoC) technique are tested, data may be inputted or outputted through the micro-bump pads of the semiconductor packages.

SUMMARY

According to an embodiment, a semiconductor device includes a first data input/output unit suitable for storing first internal input data in a first cell block in response to a first shift data strobe signal generated by shifting a first data strobe signal in a test mode. The semiconductor device also includes a second data input/output unit suitable for storing second internal input data in a second cell block in response to a second shift data strobe signal generated by shifting a second data strobe signal in the test mode. Further, the semiconductor device also includes a connector suitable for electrically coupling the first data input/output unit to the second data input/output unit in the test mode.

According to an embodiment, a semiconductor system includes a first semiconductor device and a second semiconductor device. The first semiconductor device is suitable to generate an address signal, a command signal, pattern data and a data strobe signal. In addition, the first semiconductor device is suitable to receive verification data. The second semiconductor device is suitable to store first internal input data generated from the pattern data in a first cell block in response to a first shift data strobe signal generated by shifting a first data strobe signal in a test mode; second internal input data generated from the first internal input data stored in the first cell block in a second cell block in response to a second shift data strobe signal generated by shifting a second data strobe signal in the test mode; and to output the second internal input data stored in the second cell block as the verification data in the test mode.

BRIEF DESCRIPTION OF THE DRAWINGS

FIGS. 4 and 5 are timing diagrams illustrating a method of verifying valid windows of data transmitted between cell blocks of a semiconductor system according to an embodiment in a test mode.

DETAILED DESCRIPTION

Embodiments of the invention will be described with reference to the accompanying drawings. However, the embodiments described are for illustrative purposes and are not intended to limit the scope of the invention. Various embodiments are directed to semiconductor devices providing a test mode and semiconductor systems including the same.

Figure 1:
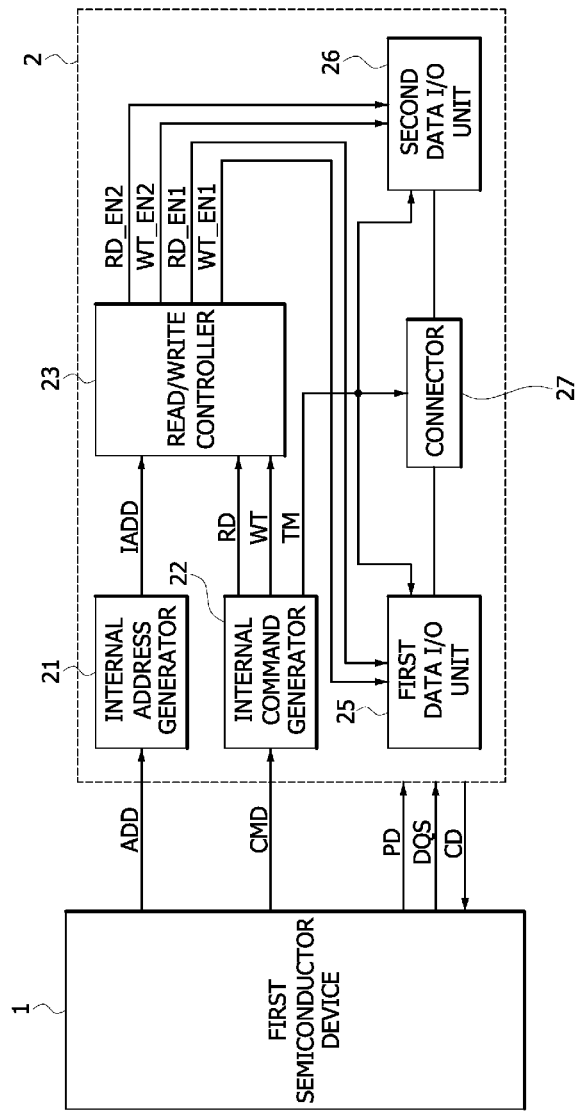
FIG. 1 is a block diagram illustrating a semiconductor system according to an embodiment of the invention.

Referring to FIG. 1, a semiconductor system according to an embodiment may include a first semiconductor device 1 and a second semiconductor device 2. The first semiconductor device 1 may apply an address signal ADD, a command signal CMD, a pattern data PD and a data strobe signal DQS to the second semiconductor device 2. The first semiconductor device 1 may receive verification data CD outputted from the semiconductor device 2 to control a timing of the data strobe signal DQS. The second semiconductor device 2 may include an internal address generator 21, an internal command generator 22, a read/write controller 23, a first data input/output (I/O) unit 25, a second data I/O unit 26, and a connector 27. The first and second semiconductor devices 1 and 2 may be realized to constitute a single chip.

The internal address generator 21 may receive and decode the address signal ADD to generate an internal address signal IADD. The internal address signal IADD may include information on cell blocks in which a read operation or a write operation is executed.

The internal command generator 22 may receive and decode the command signal CMD to generate a read signal RD, a write signal WT and a test mode signal TM. The read signal RD may be enabled to execute a read operation. Further, the write signal WT may be enabled to execute a write operation. In addition, the test mode signal TM may be enabled to execute a test mode.

The read/write controller 23 may generate a first read enablement signal RD_EN1, a first write enablement signal WT_EN1, a second read enablement signal RD_EN2 and a second write enablement signal WT_EN2 in response to the internal address signal IADD, the read signal RD and the write signal WT. The first read enablement signal RD_EN1 may be enabled to execute a read operation of a first cell block (256 of FIG. 2). The first write enablement signal WT_EN1 may be enabled to execute a write operation of the first cell block 256. The second read enablement signal RD_EN2 may be enabled to execute a read operation of a second cell block (266 of FIG. 2). The second write enablement signal WT_EN2 may be enabled to execute a write operation of the second cell block 266. In the test mode, the first data I/O unit 25 or the second data I/O unit 26 may receive and store data inputted in synchronization with the data strobe signal DQS. The connector 27 may electrically couple a pad (250 of FIG. 2) of the first data I/O unit 25 to a pad (260 of FIG. 2) of the second data I/O unit 26 in the test mode. The data stored in the first and second data I/O units 25 and 26 may be inputted or outputted through the pads 250 and 260.

Figure 2:
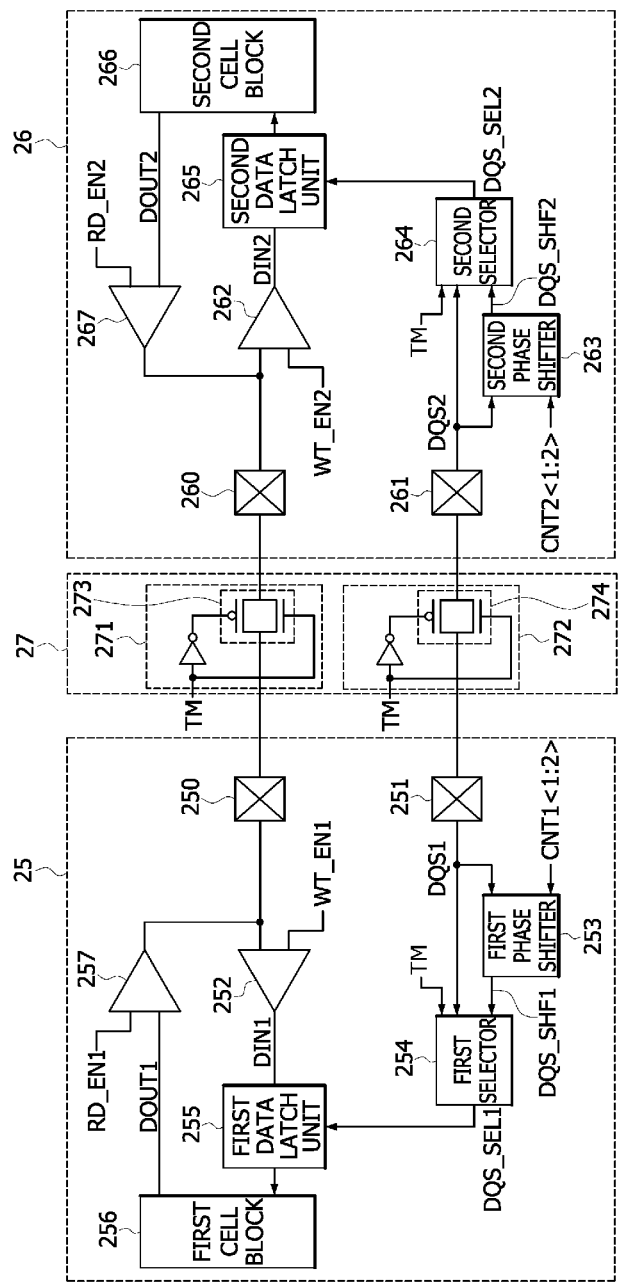
FIG. 2 is a schematic diagram illustrating a first data input/output (I/O) unit, a second data I/O unit and a connector included in the semiconductor system of FIG. 1.

Referring to FIG. 2, configurations of the first data I/O unit 25, the second data I/O unit 26 and the connector 27 in more detail are shown.

The first data I/O unit 25 may include a first pad 250, a second pad 251, a first input driver 252, a first phase shifter 253, a first selector 254, a first data latch unit 255, a first cell block 256 and a first output driver 257.

The first pad 250 may be a data pad through which data are inputted or outputted. In addition, the second pad 251 may be a pad through which data strobe signals are inputted. The first data I/O unit 25 may receive the pattern data PD outputted from the first semiconductor device 1. In addition, the first data unit I/O unit 25 may receive data outputted from a controller, and data outputted from the connector 27 through the first pad 250. The first data I/O unit 25 may also receive the data strobe signal DQS outputted from the first semiconductor device 1. The first data I/O unit 25 may also receive a data strobe signal supplied from a controller, and a data strobe signal outputted from the connector 27 through the second pad 251. The first and second pads 250 and 251 may be micro-bump pads.

The first input driver 252 may receive the data through the first pad 250 in response to the first write enablement signal WT_EN1 to drive a first internal input data DIN1. The first write enablement signal WT_EN1 may be enabled to execute a write operation of the first cell block 256.

The first phase shifter 253 may shift a first data strobe signal DQS1 inputted through the second pad 251 in response to a combination of first control signals CNT1<1:2> to generate a first shift data strobe signal DQS_SHF1. The first phase shifter 253 may control an amount of a phase that the first data strobe signal DQS1 is shifted according to a logic level combination of the first control signals CNT1<1:2>. For example, the first data strobe signal DQS1 may be shifted by a phase of 45 degrees if the first control signals CNT1<1:2> have a logic level combination of "L, H." The first data strobe signal DQS1 may be shifted by a phase of 90 degrees if the first control signals CNT1<1:2> have a logic level combination of "H, L." In addition, the first data strobe signal DQS1 may be shifted by a phase of 135 degrees if the first control signals CNT1<1:2> have a logic level combination of "H, H." If the first control signals CNT1<1:2> have a logic level combination of "L, L," the first phase shifter 253 may output the first data strobe signal DQS1 as the first shift data strobe signal DQS_SHF1 without shift of the first data strobe signal DQS1. The logic level combination "L, H" of the first control signals CNT1<1:2> means that the first control signal CNT1<2> has a logic "low" level and the first control signal CNT1<1> has a logic "high" level. The logic level combination of the first control signals CNT1<1:2> and the number of bits of the first control signals CNT1<1:2> may be set to be different according to the embodiments. The first control signals CNT1<1:2> may be supplied from the first semiconductor device 1 or may be generated in the second semiconductor device 2.

The first selector 254 may selectively output any one of the first data strobe signal DQS1 and the first shift data strobe signal DQS_SHF1 as a first selection strobe signal DQS_SEL1 in response to the test mode signal TM. The first selector 254 may selectively output the first shift data strobe signal DQS_SHF1 as the first selection strobe signal DQS_SEL1 in the test mode. In addition, the first selector 254 may selectively output the first data strobe signal DQS1 as the first selection strobe signal DQS_SEL1 out of the test mode.

The first data latch unit 255 may latch the first internal input data DIN1 in synchronization with the first selection strobe signal DQS_SEL1 to store the latched data in the first cell block 256. The first output driver 257 may drive a first internal output data DOUT1 outputted from the first cell block 256 to output the driven data to the first pad 250 in response to the first read enablement signal RD_EN1. The first read enablement signal RD_EN1 may be enabled to execute a read operation of the first cell block 256.

The second data I/O unit 26 may include a third pad 260, a fourth pad 261, a second input driver 262, a second phase shifter 263, a second selector 264, a second data latch unit 265, a second cell block 266 and a second output driver 267.

The third pad 260 may be a data pad through which data are inputted or outputted. In addition, the fourth pad 261 may be a pad through which data strobe signals are inputted. The second data I/O unit 26 may receive the pattern data PD outputted from the first semiconductor device 1. The second data I/O unit 26 may also receive data outputted from a controller, and data outputted from the connector 27 through the third pad 260. The second data I/O unit 26 may also receive the data strobe signal DQS outputted from the first semiconductor device 1. The second data I/O unit 26 may also receive a data strobe signal supplied from a controller, and a data strobe signal outputted from the connector 27 through the fourth pad 261. The third and fourth pads 260 and 261 may be micro-bump pads.

The second input driver 262 may receive the data through the third pad 260 in response to the second write enablement signal WT_EN2 to drive a second internal input data DIN2. The second write enablement signal WT_EN2 may be enabled to execute a write operation of the second cell block 266.

The second phase shifter 263 may shift a second data strobe signal DQS2 inputted through the fourth pad 261 in response to a combination of second control signals CNT2<1:2> to generate a second shift data strobe signal DQS_SHF2. The second phase shifter 263 may control an amount of a phase that the second data strobe signal DQS2 is shifted according to a logic level combination of the second control signals CNT2<1:2>. For example, the second data strobe signal DQS2 may be shifted by a phase of 45 degrees if the second control signals CNT2<1:2> have a logic level combination of "L, H." The second data strobe signal DQS2 may be shifted by a phase of 90 degrees if the second control signals CNT2<1:2> have a logic level combination of "H, L." Further, the second data strobe signal DQS2 may be shifted by a phase of 135 degrees if the second control signals CNT2<1:2> have a logic level combination of "H, H." If the second control signals CNT2<1:2> have a logic level combination of "L, L," the second phase shifter 263 may output the second data strobe signal DQS2 as the second shift data strobe signal DQS_SHF2 without shift of the second data strobe signal DQS2. The logic level combination "L, H" of the second control signals CNT2<1:2> means that the second control signal CNT2<2> has a logic "low" level and the second control signal CNT2<1> has a logic "high" level. The logic level combination of the second control signals CNT2<1:2> and the number of bits of the second control signals CNT2<1:2> may be set to be different according to the embodiments. The second control signals CNT2<1:2> may be supplied from the first semiconductor device 1. In the alternative, the second control signals CNT2<1:2> may be generated in the second semiconductor device 2.

The second selector 264 may selectively output any one of the second data strobe signal DQS2 and the second shift data strobe signal DQS_SHF2 as a second selection strobe signal DQS_SEL2 in response to the test mode signal TM. The second selector 264 may selectively output the second shift data strobe signal DQS_SHF2 as the second selection strobe signal DQS_SEL2 in the test mode. Further, the second selector 264 may selectively output the second data strobe signal DQS2 as the second selection strobe signal DQS_SEL2 out of the test mode.

The second data latch unit 265 may latch the second internal input data DIN2 in synchronization with the second selection strobe signal DQS_SEL2 to store the latched data in the second cell block 266. The second output driver 267 may drive a second internal output data DOUT2 outputted from the second cell block 266 to output the driven data to the third pad 260 in response to the second read enablement signal RD_EN2. The second read enablement signal RD_EN2 may be enabled to execute a read operation of the second cell block 266.

The connector 27 may include a first connector 271 and a second connector 272. The first connector 271 may include a transfer gate 273 turned on in response to the test mode signal TM. The transfer gate 273 may be turned on to electrically couple the first pad 250 to the third pad 260 if the test mode signal TM has a logic "high" level in the test mode. The second connector 272 may include a transfer gate 274 turned on in response to the test mode signal TM. The transfer gate 274 may be turned on to electrically couple the second pad 251 to the fourth pad 261 if the test mode signal TM has a logic "high" level in the test mode.

Figure 3:
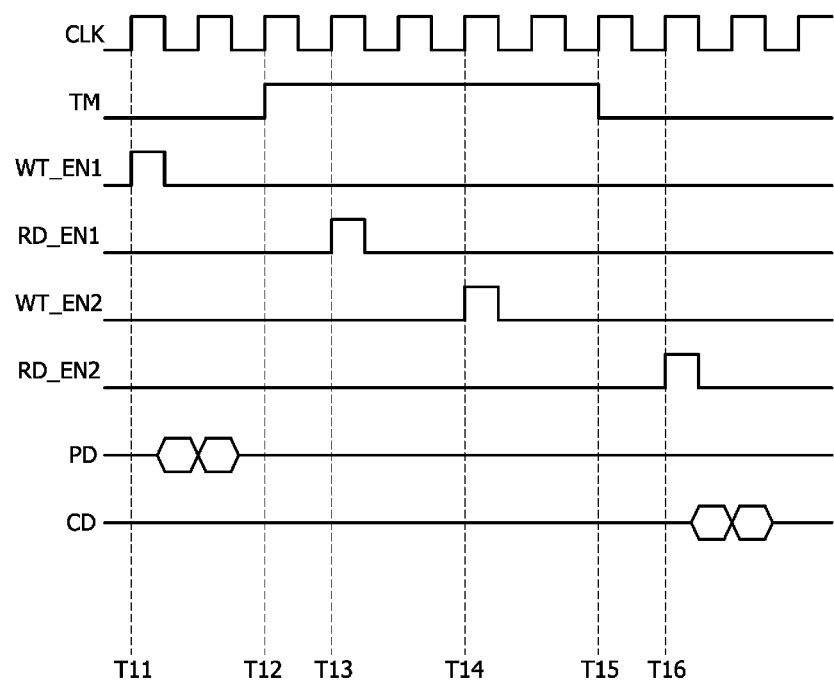
FIG. 3 is a timing diagram illustrating a test mode operation executed to verify a normality/abnormality of an interface in the semiconductor system of FIG. 1.

A test mode operation executed to verify a normality/abnormality of an interface of the semiconductor system shown in FIGS. 1 and 2 will be described more fully with reference to FIG. 3.

At time "T11," if the first write enablement signal WT_EN1 is enabled to execute a write operation of the first cell block 256, the pattern data PD outputted from the first semiconductor device 1 may be stored in the first cell block 256. At time "T12," if the semiconductor system enters the test mode, a level of the test mode signal TM may be changed from a logic "low" level to a logic "high" level. At time "T13," if the first read enablement signal RD_EN1 is enabled to execute a read operation of the first cell block 256, the data stored in the first cell block 256 may be outputted through the first pad 250 and may be transmitted to the third pad 260 through the connector 27 turned on by the test mode signal TM. At time "T14," if the second write enablement signal WT_EN2 is enabled to execute a write operation of the second cell block 266, the data inputted through the third pad 260 may be stored in the second cell block 266. At time "T15," if the test mode terminates, a level of the test mode signal TM may be changed from a logic "high" level to a logic "low" level. At time "T16," if the second read enablement signal RD_EN2 is enabled to execute a read operation of the second cell block 266 after termination of the test mode, the data stored in the second cell block 266 may be outputted as the verification data CD through the third pad 260 and the verification data CD may be transmitted to the first semiconductor device 1.

The first semiconductor device 1 may compare the verification data CD with the pattern data PD to verify a normality/abnormality of an I/O interface including the first input driver 252, the first output driver 257, the second input driver 262 and the second output driver 267. More specifically, the I/O interface may be regarded as normally operating if the verification data CD is equal to the pattern data PD. Further, the I/O interface may be regarded as abnormally operating if the verification data CD is different from the pattern data PD.

Hereinafter, a method of verifying valid windows of data transmitted through the first connector 271 will be described in detail with reference to FIGS. 4 and 5 with an example in which the data stored in the first cell block 256 is transmitted to the second cell block 266 through the first connector 271 and stored in the second cell block 266.

Figure 4:
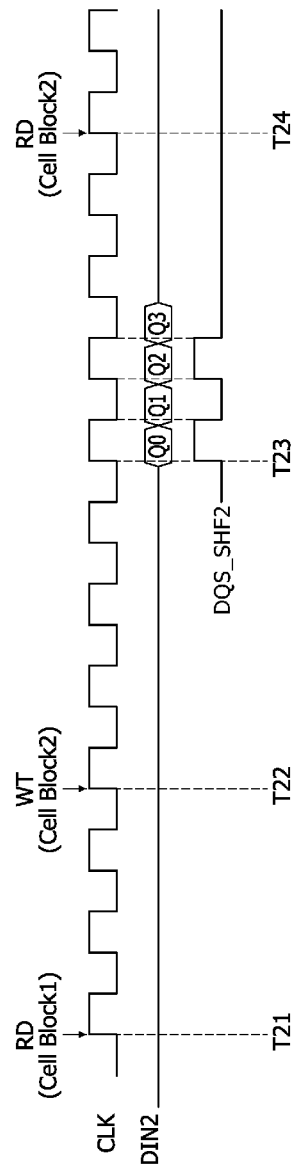

Referring to FIG. 4, if a read operation of the first cell block 256 is executed at time "T21" and a write operation of the second cell block 266 is then executed at time "T22," the data stored in the first cell block 256 may be transmitted to the second cell block 266 through the first connector 271. At time "T23," the second cell block 266 may receive and store the second internal input data DIN2 in synchronization with the second shift data strobe signal DQS_SHF2. If a read operation of the second cell block 266 is executed at time "T24," the data stored in the second cell block 266 may be outputted as the verification data CD and the verification data CD may be transmitted to the first semiconductor device 1. The first semiconductor device 1 may receive the verification data CD to verify a valid window of the data. The valid window of the data may be verified by sequentially changing a logic level combination of the second control signals CNT2<1:2> to change a phase of the second shift data strobe signal DQS_SHF2. In addition, the valid window of the data may be verified by sensing in the first semiconductor device 1 whether each of bits Q0, Q1, Q2 and Q3 included in the verification data CD is consistent with the pattern data PD according to the phase of the second shift data strobe signal DQS_SHF2.

More specifically, referring to FIG. 5, the first semiconductor device 1 may synchronize a central point of the data transmitted through the first connector 271 with the second shift data strobe signal DQS_SHF2 by controlling a pulse width (see a portion "X" of FIG. 5) of a clock signal CLK inputted in advance of the data strobe signal DQS. The second shift data strobe signal DQS_SHF2 may be generated by shifting a phase of the data strobe signal DQS transmitted through the second connector 272. In addition, the data strobe signal DQS may be generated from the clock signal CLK in the first semiconductor device 1. Accordingly, if the clock signal CLK is shifted, the second shift data strobe signal DQS_SHF2 may also be shifted. The first semiconductor device 1 may sequentially change the logic level combination of the second control signals CNT2<1:2> into "L, L", "L, H", "H, L" and "H, H" to generate the second shift data strobe signals DQS_SHF2 shifted by phases of 0 degree, 45 degrees, 90 degrees and 135 degrees. Apropos of each of the second shift data strobe signals DQS_SHF2 shifted by phases of 0 degree, 45 degrees, 90 degrees and 135 degrees, the first semiconductor device 1 may verify a valid window of the data by sensing whether each of bits Q0, Q1, Q2 and Q3 included in the verification data CD are consistent with the pattern data PD. The first semiconductor device 1 may control a timing of the data strobe signal DQS to prevent an abnormality of the I/O interface according to a valid window of the data confirmed by comparing the verification data CD with the pattern data PD.

According to the embodiments set forth above, a semiconductor system may control a phase of a data strobe signal to provide a test mode that verifies a valid window of a data internally transmitted. Accordingly, a normality/abnormality of an interface of the semiconductor system may be readily verified even at a wafer level before the semiconductor system is packaged.

What is claimed is:

1. A semiconductor device comprising:
   a first data input/output unit suitable for storing first internal input data in a first cell block in response to a first shift data strobe signal generated by shifting a first data strobe signal in a test mode;
   a second data input/output unit suitable for storing second internal input data in a second cell block in response to a second shift data strobe signal generated by shifting a second data strobe signal in the test mode; and
   a connector suitable for electrically coupling the first data input/output unit to the second data input/output unit in the test mode.

2. The semiconductor device of claim 1,
   wherein the first data input/output unit includes a first pad to which a data strobe signal for generating the first data strobe signal is applied; and
   wherein the second data input/output unit includes a second pad to which the data strobe signal for generating the second data strobe signal is applied.

3. The semiconductor device of claim 2, wherein the connector includes a first connector that electrically couples the first pad to the second pad in the test mode.

4. The semiconductor device of claim 3,
   wherein the first data input/output unit includes a third pad to which data for generating the first internal input data are applied; and
   wherein the second data input/output unit includes a fourth pad to which data for generating the second internal input data are applied.

5. The semiconductor device of claim 4, wherein the connector includes a second connector that electrically couples the third pad to the fourth pad in the test mode.

6. The semiconductor device of claim 1, wherein the first data input/output unit includes a first phase shifter suitable for shifting the first data strobe signal by a predetermined phase in response to a first control signal to generate the first shift data strobe signal.

7. The semiconductor device of claim 6, wherein the first data input/output unit further includes:
   a first selector suitable for selectively outputting any one of the first shift data strobe signal and the first data strobe signal as a first selection strobe signal;
   a first input driver suitable for driving data inputted through a first pad in response to a first write enablement signal to generate the first internal input data; and
   a first data latch unit suitable for latching the first internal input data in synchronization with the first selection strobe signal to store the latched first internal input data in the first cell block.

8. The semiconductor device of claim 7, wherein the first data input/output unit further includes a first output driver suitable for driving first internal output data stored in the first cell block in response to a first read enablement signal to output the driven first internal output data to the first pad.

9. The semiconductor device of claim 8,
   wherein the first write enablement signal is configured to execute a write operation of the first cell block; and
   wherein the first read enablement signal is configured to execute a read operation of the first cell block.

10. The semiconductor device of claim 1, wherein the second data input/output unit includes a second phase shifter suitable for shifting the second data strobe signal by a predetermined phase in response to a second control signal to generate the second shift data strobe signal.

11. The semiconductor device of claim 10, wherein the second data input/output unit further includes:
    a second selector suitable for outputting any one of the second shift data strobe signal and the second data strobe signal as a second selection strobe signal;
    a second input driver suitable for driving data inputted through a second pad in response to a second write enablement signal to generate the second internal input data; and
    a second data latch unit suitable for latching the second internal input data in synchronization with the second selection strobe signal to store the latched second internal input data in the second cell block.

12. The semiconductor device of claim 11, wherein the second data input/output unit further includes a second output driver suitable for driving second internal output data stored in the second cell block in response to a second read enablement signal to output the driven second internal output data to the second pad.

13. The semiconductor device of claim 12,
    wherein the second write enablement signal is configured to execute a write operation of the second cell block; and
    wherein the second read enablement signal is configured to execute a read operation of the second cell block.

14. A semiconductor system comprising:
    a first semiconductor device suitable for generating an address signal, a command signal, pattern data and a data strobe signal and suitable to receive verification data; and
    a second semiconductor device suitable to store first internal input data generated from the pattern data in a first cell block in response to a first shift data strobe signal generated by shifting a first data strobe signal in a test mode, second internal input data generated from the first internal input data stored in the first cell block in a second cell block in response to a second shift data strobe signal generated by shifting a second data strobe signal in the test mode, and to output the second internal input data stored in the second cell block as the verification data in the test mode.

15. The semiconductor system of claim 14, wherein the first semiconductor device compares the verification data with the pattern data to control a timing of the data strobe signal.

16. The semiconductor system of claim 14, wherein the second semiconductor device includes a first pad to which the data strobe signal to generate the first data strobe signal is applied and a second pad to which the data strobe signal to generate the second data strobe signal is applied.

17. The semiconductor system of claim 16, wherein the second semiconductor device further includes a first connector that electrically couples the first pad to the second pad in the test mode.

18. The semiconductor system of claim 17, wherein the second semiconductor device further includes a third pad receiving the pattern data to generate the first internal input data and a fourth pad receiving data that are stored in the first cell block to generate the second internal input data.

19. The semiconductor system of claim 18, wherein the second semiconductor device further includes a second connector that electrically couples the third pad to the fourth pad in the test mode.

20. The semiconductor system of claim 14, wherein the second semiconductor device includes:
   a phase shifter suitable for shifting the first data strobe signal by a predetermined phase in response to a control signal to generate the first shift data strobe signal;
   a selector suitable for selectively outputting any one of the first shift data strobe signal and the first data strobe signal as a selection strobe signal;
   an input driver suitable for driving data inputted through a pad in response to a write enablement signal to generate the first internal input data; and
   a data latch unit suitable for latching the first internal input data in synchronization with the selection strobe signal to store the latched first internal input data in the first cell block.

* * * * *